(12) United States Patent
Qi

(10) Patent No.: US 9,607,533 B1
(45) Date of Patent: Mar. 28, 2017

(54) VENTED LED DISPLAY AND METHOD OF MANUFACTURING

(71) Applicant: DIGITAL OUTDOOR LLC, Miami, FL (US)

(72) Inventor: Zeming Qi, Shenzhen (CN)

(73) Assignee: DIGITAL OUTDOOR LLC, Miami, FL (US)

( * ) Notice: Subject to any disclaimer, the term of this patent is extended or adjusted under 35 U.S.C. 154(b) by 0 days.

(21) Appl. No.: 15/053,789

(22) Filed: Feb. 25, 2016

(51) Int. Cl.
| | |
|---|---|
| *A45B 3/02* | (2006.01) |
| *G09F 13/34* | (2006.01) |
| *G09F 13/22* | (2006.01) |
| *B29C 45/00* | (2006.01) |
| *B29L 12/00* | (2006.01) |

(52) U.S. Cl.
CPC ............ *G09F 13/34* (2013.01); *B29C 45/006* (2013.01); *G09F 13/22* (2013.01); *B29L 2012/00* (2013.01); *G09F 2013/222* (2013.01)

(58) Field of Classification Search
CPC ........ G09F 27/008; G09F 19/22; G09F 13/28; G09F 19/226; G09F 2013/0472; G09F 2013/222; G09F 9/00; Y10S 362/812; E06B 7/08; E06B 7/082; F24F 13/08; F28D 2021/0029; F28F 13/08; F21V 33/0088; F21V 11/04
USPC ....... 362/812, 294, 240, 241, 290, 218, 248, 362/342, 345, 249.01, 249.02, 249.06, 362/249.14, 264, 354, 373, 646; 40/606.01, 611.08, 564, 489, 624
See application file for complete search history.

(56) References Cited

U.S. PATENT DOCUMENTS

| | | | | |
|---|---|---|---|---|
| 2,075,764 | A * | 3/1937 | Marten | G09F 13/00 40/576 |
| 2,633,652 | A * | 4/1953 | Wagner | G09F 7/08 40/622 |
| 3,599,348 | A * | 8/1971 | Richardson | G09B 23/12 40/491 |
| 3,768,187 | A * | 10/1973 | Dunne | G09F 7/16 40/602 |
| 3,837,105 | A * | 9/1974 | Tchakgarian | G09F 7/002 40/541 |
| 4,237,637 | A * | 12/1980 | Bourbon | G09B 1/02 40/618 |
| 5,588,238 | A * | 12/1996 | Visocky | G09F 7/10 40/575 |
| 5,685,634 | A | 11/1997 | Mulligan | |
| 5,715,619 | A | 2/1998 | Polisois et al. | |
| 6,169,632 | B1 | 1/2001 | Kurtenbach et al. | |
| 6,813,853 | B1 * | 11/2004 | Tucker | G09F 9/33 340/815.45 |

(Continued)

*Primary Examiner* — Robert May
*Assistant Examiner* — Tsion Tumebo
(74) *Attorney, Agent, or Firm* — The Concept Law Group, P.A.; Scott D. Smiley; Yongae Jun

(57) ABSTRACT

A vented LED display is described including an LED display panel having a plurality of LEDs disposed thereon and defining a plurality of vent slots between the plurality of LEDs, each of the plurality of vent slots having a vent height. The vented LED display also includes a unitary injection-molded vent having a plurality of louvers and coupled to the LED display panel such that each louver corresponds to at least one vent slot and includes a louver length extending downwardly to at least 75% of the vent height of the corresponding vent slot.

13 Claims, 12 Drawing Sheets

(56) References Cited

U.S. PATENT DOCUMENTS

| | | |
|---|---|---|
| 7,105,858 B2 | 9/2006 | Popovich |
| 7,144,748 B2 | 12/2006 | Popovich |
| 7,407,306 B2 | 8/2008 | DeMarb et al. |
| 7,579,218 B2 | 8/2009 | Popovich |
| 7,877,910 B2 | 2/2011 | Thorjussen et al. |
| 8,172,097 B2 | 5/2012 | Nearman et al. |
| 8,350,788 B1 * | 1/2013 | Nearman ............... G09F 9/3026 315/169.3 |
| 8,851,711 B2 * | 10/2014 | Ladewig .................. F21S 2/00 362/249.02 |
| 9,038,296 B2 | 5/2015 | Melic |
| 9,134,773 B2 | 9/2015 | Hall |
| 2014/0090281 A1 | 4/2014 | Jansen |
| 2014/0153241 A1 * | 6/2014 | Templeton .............. F21V 21/00 362/249.02 |

\* cited by examiner

100

100

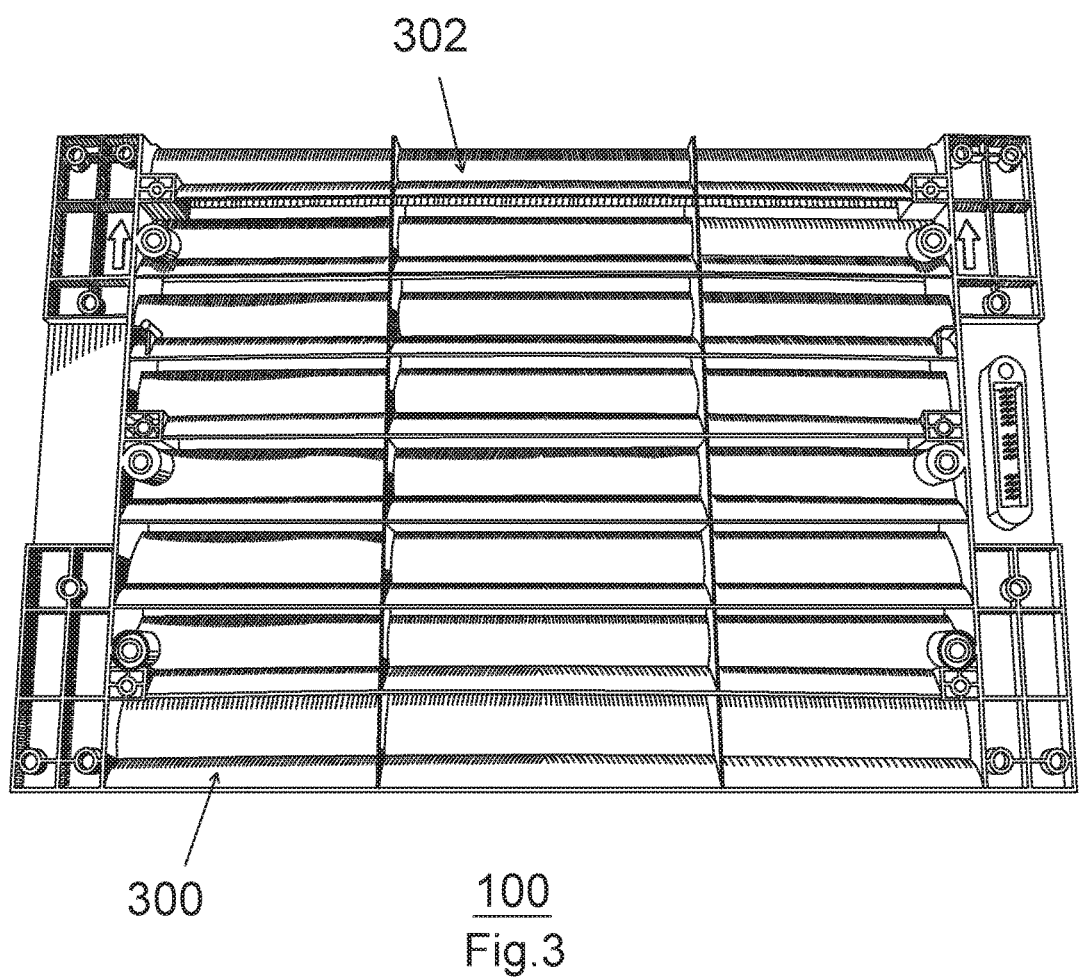

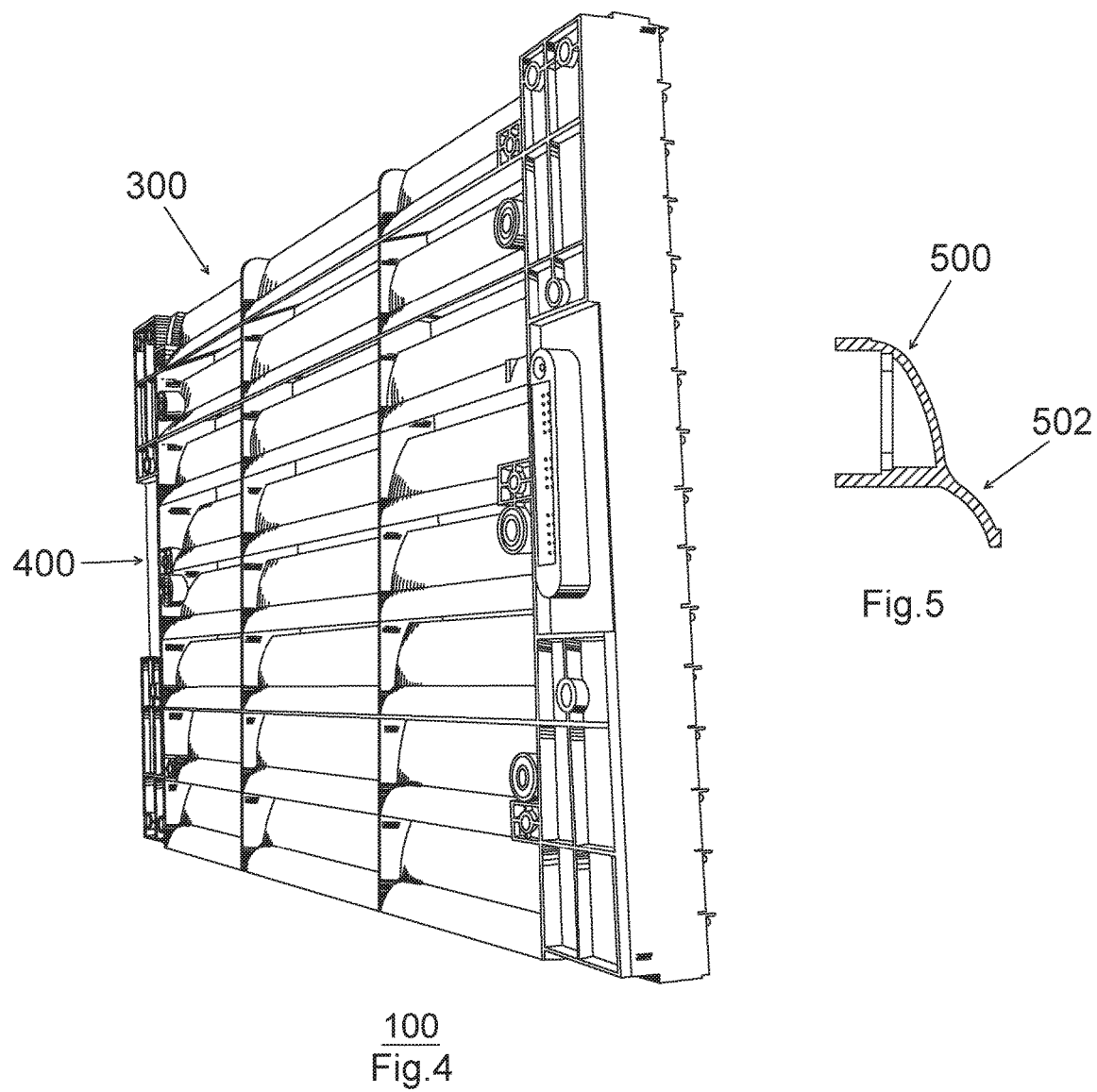

100

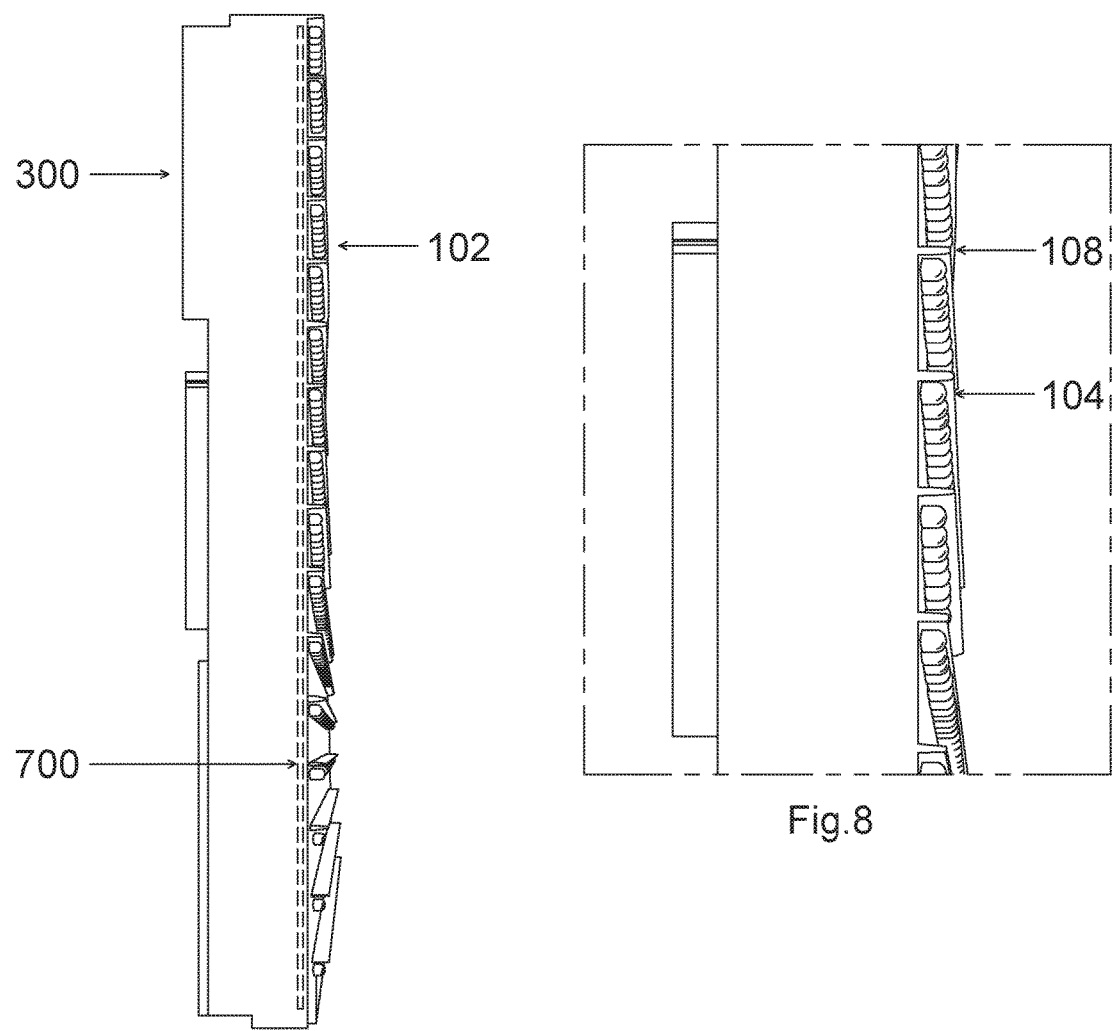

900

900

900

900

900

900

900
Fig.15
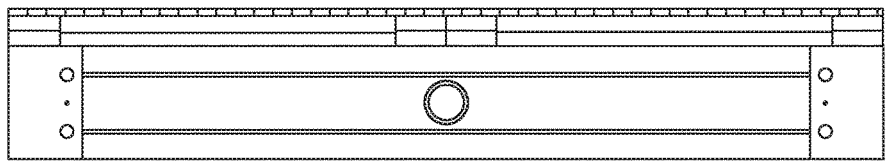
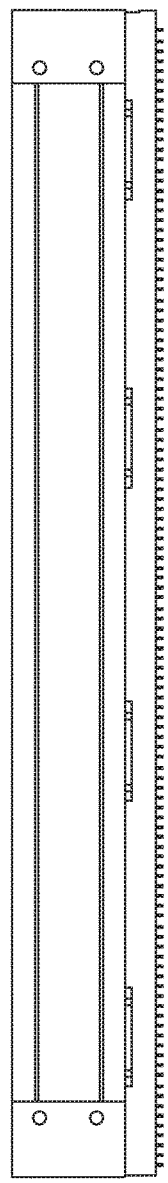
900
Fig.16

VENTED LED DISPLAY AND METHOD OF MANUFACTURING

FIELD OF THE INVENTION

The present invention relates generally to LED displays, and, more particularly, relates to a vented LED display and method of manufacturing the same.

BACKGROUND OF THE INVENTION

Outdoor light-emitting diode (LED) signs are known for various purposes, such as for traffic signage, advertisement billboards, outdoor sporting events, etc. Outdoor LED signs have many challenges, such as ruggedization to withstand outdoor environmental conditions (e.g., wind, rain, dust/debris, and other weather and temperature conditions), power requirements and heat dissipation for the multitude of LEDs required to display outdoor viewable messages and content, accessibility to internal components for maintenance purposes, brilliance and contrast in the LED pixels, and costs associated with manufacturing such often large structures, to name a few.

Often, improvements in one area will result in drawbacks associated with another area. For example, one problem with outdoor LED signs is increasing the brilliance and contrast of the LED pixels, while not also increasing power consumption of the LED sign and heat generation. Further, increased power consumption and heat generation will often result in the need to construct heavier, more complicated systems, which in-turn increases manufacturing costs. U.S. Pat. No. 6,169,632 (Kurtenbach et al.) attempted to at least solve some of these problems by creating a modular display system in which each modular display panel included a circuit board with various LED pixels mounted in a housing. Further, the modular display panels in Kurtenbach et al. includes louver panels interspersed with the LED pixels to shade the LED pixels from ambient light, thereby improving the view contrast and viewability. In addition, each modular display panel in Kurtenbach et al. is secured to one or more modular support members by quick connect latches and includes a driver board and a power supply securable to the modular display by twist-on fasteners. Accessibility is provided on both sides of the Kurtenbach et al. display system through the quick connect latches and ready removability of the circuit boards and louver panels.

Unfortunately, the modular display system in Kurtenback et al. suffered from at least one major drawback. For outdoor LED signs, there is a problem of high wind resistance due to their solid surfaces and their considerable size, which is often required in order for the LED pixels to be visible from long distances. Further, outdoor LED signs are often placed at higher altitudes for greater visibility, which increases the wind resistance even more because wind resistance tends to increase at higher altitudes.

U.S. Pat. No. 7,407,306 (DeMarb et al.) addressed this problem by providing an aerodynamic display panel with a plurality of stacked layers wings with space between the layers to allow air, rain, and other elements to pass through. Unfortunately, the DeMarb et al. aerodynamic display panel suffers from a multitude of drawbacks. Initially, the layers have a wing-shaped cross-section which, as wind flows through the wing layers, results in a lifting force caused by the pressure difference above the wing as compared to the pressure below the wing. Accordingly, such lifting forces will create a strain on the aerodynamic display panel. In addition, the risk of wind forces knocking down the display panel of DeMarb et al. is increased as a result of both horizontal wind forces and vertical lifting forces acting on the display panel simultaneously. In addition, each layer in DeMarb et al. is a separate enclosure for an LED to provide protection to the electrical components from environmental hazards. Unfortunately, such design results in a rather complicated and difficult to assemble and manufacture display panel including horizontal support receivers and vertical support receivers built into each layer and corresponding vertical and horizontal support beams to be routed through such receivers in order to assemble the display and support the layer enclosures thereon. Accordingly, the manufacturing and assembling the DeMarb et al. aerodynamic display panel would be rather costly and time-consuming. Furthermore, the DeMarb et al. aerodynamic display panel is not readily accessible for maintenance purposes. If even one of the layers requirement repair or replacement, it would be rather time consuming to disassemble the display panel in order to perform the repair or replacement. Also, it would be difficult to selectively program the DeMarb et al. sign to display varying messages and/or content on-the-fly as each layer is a separate enclosure shielding its electrical components from environmental hazards.

Therefore, a need exists to overcome the problems with the prior art as discussed above.

SUMMARY OF THE INVENTION

The invention provides a vented LED display and method of manufacturing that overcomes the hereinafore-mentioned disadvantages of the heretofore-known devices and methods of this general type.

With the foregoing and other objects in view, there is provided, in accordance with the invention, a vented LED display including an LED display panel having a plurality of LEDs disposed thereon and defining a plurality of vent slots between the plurality of LEDs, each of the plurality of vent slots having a vent height; and a unitary injection-molded vent having a plurality of louvers and coupled to the LED display panel such that each louver corresponds to at least one vent slot and includes a louver length extending downwardly to at least 75% of the vent height of the corresponding at least one vent slot.

In accordance with yet another feature of the present invention, each louver of the unitary injection-molded vent and each corresponding at least one vent slot of the LED display panel together defining a fluid pathway shaped and configured to allow fluid to flow through the vented LED display from a front face thereof through a rear face thereof.

In accordance with another feature of the present invention, the LED display panel is a borderless panel.

In accordance with an additional feature of the present invention, the LED display panel is a unitary injection-molded structure.

In accordance with a further feature of the present invention, the LED display panel and the unitary injection-molded vent together form a housing for one or more electronic components associated with the plurality of LEDs disposed on the LED display panel.

In accordance with another feature of the present invention, the plurality of LEDs disposed on the LED display panel is arranged as a plurality of horizontal LED rows disposed between the plurality of vent slots.

In accordance with yet another feature of the present invention, each of the plurality of louvers is disposed rearward of the at least one corresponding vent slot.

In accordance with yet another feature, for each vent slot, the corresponding louver includes an opaque surface disposed rearward of the vent slot and positioned to block light from passing through a substantial portion thereof.

In accordance with a further feature of the present invention, the LED display panel is a unitary injection-molded structure including a plurality of LED shades positioned above each of the plurality of LEDs disposed on the LED display panel so as to block light emitting from the plurality of LEDs in a vertical direction.

In accordance with another feature of the present invention, each of the plurality of louvers includes a cross-section with a first convex portion disposed forward of and transitioning into a second convex portion when viewed from a rear face of the unitary injection-molded vent.

In accordance with yet another feature of the present invention, the first convex portion forms at least a portion of an electrical component housing for the plurality of LEDs disposed on the LED display panel; and the second convex portion forms the louver length extending downwardly to at least 75% of the vent height of the corresponding at least one vent slot.

In accordance with another feature of the present invention, the plurality of LEDs disposed on the LED display panel is arranged as a plurality of LED rows disposed between the plurality of vent slots; and each of the plurality of LED rows extends from edge-to-edge on the LED display panel such that when an adjacent vented LED display is coupled thereto to form an outdoor LED sign each of the LED rows forms a continuous LED row with one or more horizontally adjacent vented LED displays coupled thereto.

In accordance with another feature, an embodiment of the present invention also includes a vented LED display having a monolithic LED display panel having LEDs disposed thereon in a matrix arrangement of rows and columns separated by one or more vent slots between the rows; and a vent formed as a unitary structure, coupled to the monolithic LED display panel, and having a plurality of louvers, each of the plurality of louvers corresponding to at least one of the one or more vent slots so as to define a fluid pathway shaped and configured to allow fluid to flow through the vented LED display from a front face thereof through a rear face thereof.

In accordance with another feature of the present invention, each of the monolithic LED display panel and the vent are at least one of an injection molded structure and a die-cast structure.

In accordance with another feature of the present invention, each of the plurality of louvers is disposed rearward of the monolithic LED display panel.

In accordance with yet another feature, an embodiment of the present invention includes a method of manufacturing a vented LED display, the method including steps of providing a first three-dimensional pattern formed on a molding surface of a first mold; and injecting a polymeric fluid material into the first mold and curing the polymeric fluid material in the first mold so as to form a first injection-molded member including an LED display panel surface defining one or more vent slots, each vent slot including a vent height. Further, the method may also include providing a second three-dimensional pattern formed on a molding surface of a second mold; and injecting a polymeric fluid material into the second mold and curing the polymeric fluid material in the second mold so as to form a second injection-molded member including a plurality of louver surfaces arranged so that each louver surface includes a louver length that extends downwardly to at least 75% of the vent height.

In accordance with a further feature of the present invention, the method includes coupling LEDs to a printed circuit board (PCB) so that the LEDs are in a matrix arrangement of rows and columns.

In accordance with another feature of the present invention, the method includes after the step of coupling LEDs to the PCB, positing the PCB between the first and second injection-molded members and coupling the first injection-molded member to the second injection-molded member to form the vented LED display with the one or more vent slots between the rows of LEDs.

Although the invention is illustrated and described herein as embodied in a vented LED display and method of manufacturing, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the LED display panel. The terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 3 is a rear, perspective view of the vented LED display of FIG. 1, showing a vent with a plurality of louvers disposed rearward of the LED display panel, in accordance with an embodiment of the present invention;

FIG. 4 is a rear, side perspective view of the vented LED display of FIG. 1, in accordance with an embodiment of the present invention;

FIG. 5 is a cross-sectional side view of a single louver of the vented LED display of FIG. 1, in accordance with an embodiment of the present invention;

FIG. 7 is a side view of the vented LED display of FIG. 1, in accordance with an embodiment of the present invention;

FIG. 8 is partial, enlarged side view of the vented LED display of FIG. 1, in accordance with an exemplary embodiment of the present invention;

FIG. 15 is a top plan view of the outdoor LED sign of FIG. 9, in accordance with an embodiment of the present invention;

FIG. 16 is an elevational right side view of the outdoor LED sign of FIG. 9, in accordance with an embodiment of the present invention.

DETAILED DESCRIPTION

Figure 1:
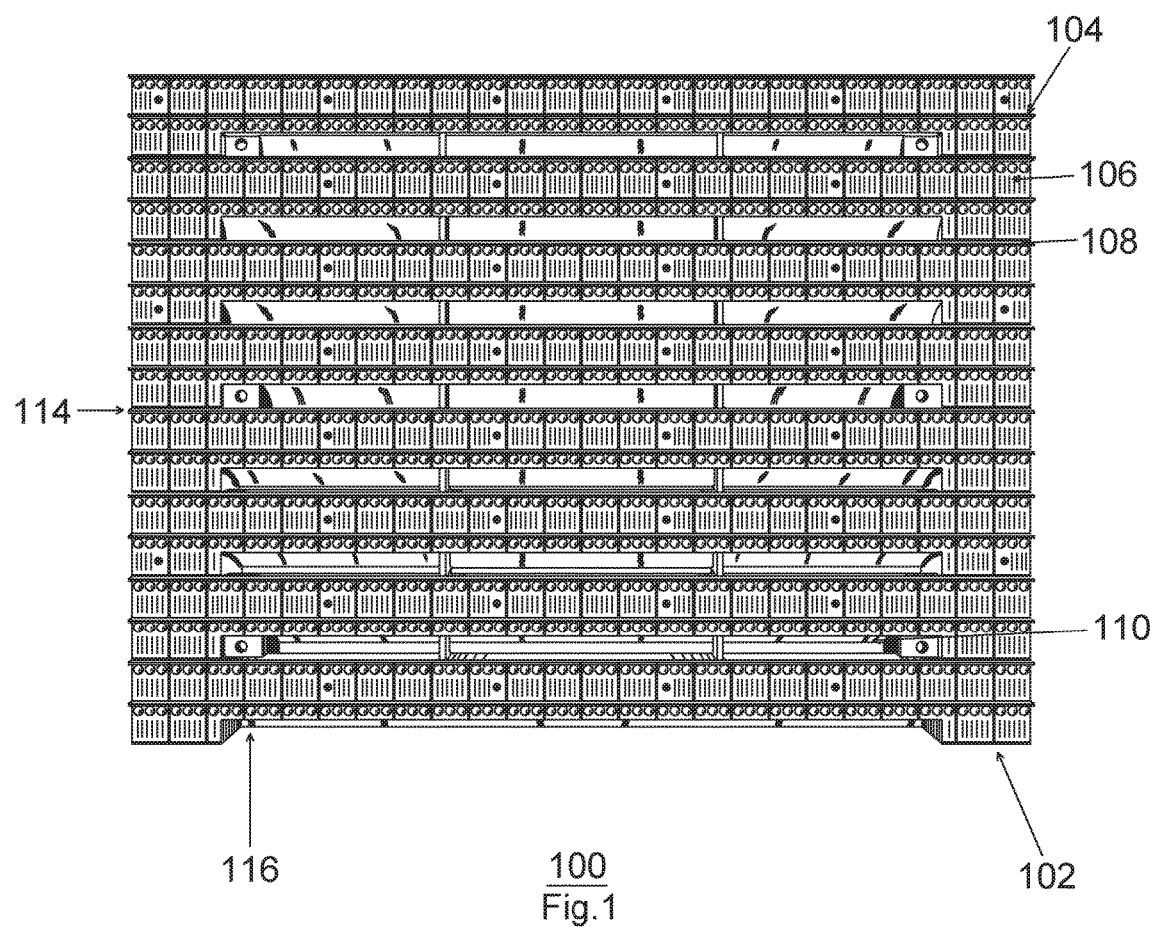
FIG. 1 is a front, perspective view of a vented LED display, showing an LED display panel with a matrix arrangement of LEDs disposed thereon and a plurality of vent slots between rows of LEDs, in accordance with an embodiment of the present invention.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

The present invention provides a novel and efficient vented LED display module that is particularly suitable for outdoor usage as an outdoor LED sign. Embodiments of the invention provide a vented LED display module with a front face having a plurality of LEDs disposed thereon in a matrix arrangement of LED rows and columns, the front face defining a plurality of vent slots disposed between LED rows to reduce the wind resistance of the LED sign. In addition, embodiments of the invention provide a rear face formed as a unitary vent having a plurality of louvers that, when the unitary vent is coupled to the front face, defines a plurality of fluid pathways that allows air to flow completely through the vented LED display module. In a further embodiment, the vented LED display module is operably configured to allow air to flow through the vent slots and be directed downward by the corresponding louver. Stated another way, embodiments of the present invention allow air to flow through a matrix arrangement of vent slots defined by the front face and out through the rear face through the plurality of louvers. In addition, embodiments of the present invention provide for the louvers to extend downwardly past a substantial height of the corresponding vent slot so as to provide a contrasting opaque surface for the sign, enhancing viewability thereof by viewers viewing from the sign from the front face.

Referring now to FIG. 1, one embodiment of the present invention is shown in a front, perspective view. FIG. 1 shows several advantageous features of the present invention, but, as will be described below, the invention can be provided in several shapes, sizes, combinations of features and components, and varying numbers and functions of the components. The first example of a vented LED display 100, as shown in FIG. 1, includes an LED display panel 102 having a plurality of LEDs 104 disposed thereon.

The LED display panel 102 can be considered a structure on which the LEDs 104 are disposed and that forms a front, viewing side of the vented LED display 100. Such front, viewing side of the LED display panel 102 can be considered a front face 106 of the vented LED display panel 102. As used herein, the term "front face" is intended to indicate one or more surface(s) on the front side of the LED display panel 102 that are viewable by a user viewing the vented LED display 100 from the front side, where the LEDs 104 are disposed. In a preferred embodiment, the front face 106 is an opaque surface of a dark color (e.g., black) so as to provide a contrasting surface for the lights emitting from the LEDs 104. In another embodiment, the front face 106 is the same color as the louvers so as to provide a uniform appearance (discussed herein in more detail below). As used herein, unless otherwise expressly indicated herein, any discussion of orientation, direction, disposition, position, or other configuration of elements of the vented LED display 100 and any components thereof pertains to the display 100 in its operational configuration, in an upright orientation, perpendicular to a planar ground surface. Further, terms such as, "front," "back," "rear," "forward," "rearward," "top," "bottom," "up," "down," "downwardly," "left and right sides," and the like, are indicated from the reference point of a viewer viewing the LED display 100 from its front face 106, where the LEDs 104 are disposed.

In a preferred embodiment, the LED display panel 102 is a unitary structure. Advantageously, this provides a significant advantage over prior art LED displays that are more complicated to manufacture, assemble, repair, and access for maintenance purposes, as discussed above. In one preferred embodiment, the LED display panel 102 is a unitary injection-molded structure. As used herein, the term "molded" may be used without the term "injection," yet it is understood that the term "molded" refers to a structure that has been formed from an injection-molding manufacturing process, as is known in the art. In an alternative embodiment, the LED display panel 102 may be formed as a unitary metallic structure through a die casting manufacturing process, rather than as a unitary polymer-based structure, as with the injection-molding process. In other embodiments, the LED display panel 102 may be formed with other types of manufacturing processes.

In one embodiment, the front face 106 is formed with a generally planar surface. In a further embodiment, the front face 106 may include miniscule ridges and/or grooves not readily visible by viewers from a far distance. In other embodiments, the front face 106 may be provided as other shapes and configurations, such as a slightly curved surface, for example. In yet other embodiments, the front face 106 may include a plurality of shades 108 (see also FIG. 8 for an enlarged view of the shades 108). The shades 108 may be disposed directly above the LEDs 104 for various purposes, such as, for example, to block light emitting in a vertical direction from rows of LEDs above and below for greater visual clarity, to shield the LEDs 104 from environmental elements, and the like. In a preferred embodiment, the shades 108 are integral to the front face 106 of the LED display panel 102 for ease of assembly. For example, the LED display panel 102 may be a unitary injection-molded structure with the plurality of shades 108. In another embodiment, the LED display panel 102 may be a unitary die cast structure with the plurality of shades 108. In an alternative embodiment, the shades 108 may be coupled to the LED display panel 102 during the manufacturing process, after the body providing the primary structure for the LED display panel 102 is formed. In yet other embodiments, the front face 106 may be provided with other components and features.

Importantly, the LED display panel 102 is a vented display panel, defining a plurality of vent slots 110 between the LEDs 104. As used herein, the term "vent slot" is intended to indicate a through-opening that allows fluid, such as air and liquid, to pass through from one side and out through the other opposing side. Although the term "slot" is used in the term "vent slot," the invention is not intended to be limited to a particular shaped opening, and is intended in its most broad sense to be inclusive of any shape of through-opening that that allows fluid to pass through from one side and out through the other opposing side of the LED display panel 102. The vent slots 110 may be, for example, rectilinear shaped, as shown in the exemplary embodiment. In another embodiment, the vent slots 110 may be circular, or oval-shaped. In yet another embodiment, the vent slots 110 may be elongated and narrow, or, alternatively, may be short and wide. In yet another embodiment, the plurality of vent slots 110 may each be the same shape. In an alternative embodiment, the plurality of vent slots 110 may be provided in shapes that vary from one to another.

In one embodiment, one or more vent slots 110 are defined by the LED display panel 102 between LED rows 114. In a further embodiment, one or more vent slots 110 are defined by the LED display panel 102 between horizontal rows of LEDs 114. Stated another way, the LEDs 104 may be disposed on the LED display panel 102 arranged as a plurality of horizontal rows of LEDs 114 disposed between one or more vent slots 110. There may be provided a single vent slot 110 between LED rows 114, or more than one vent slots 110 between LED rows 114 as in the exemplary embodiment. In such embodiment, the one or more vent slots 110 may be horizontally aligned to form a row of vent slots 110 between LED rows 114. In one embodiment, there may be more than one LED row 114 disposed between rows of vent slots 110. For example, in order to increase the number of LED pixels provided on the LED display panel 102, there can be provided a pair of horizontal LED rows 114 disposed between each row of vent slots 110, as in the exemplary embodiment. In other embodiments, there may be provided less than or more than two rows of LEDs 114 between rows of vent slots 110.

In one embodiment, the LED display panel 102 can be considered a monolithic LED display panel 102 with LEDs disposed thereon in a matrix arrangement of rows 114 and columns 116 of LEDs 104 separated by one or more vent slots 110 between the rows 114. In another embodiment, the plurality of LEDs 104 may be disposed on the LED display panel 102 in other patterns and configurations. For example, in one embodiment, the plurality of LEDs 104 may be arranged in diagonal lines. In another embodiment, the plurality of LEDs 104 may be arranged as a circular-shaped matrix, rather than a rectangular matrix arrangement, as depicted in the exemplary embodiment. There are many arrangements of LEDs 104 that can be provided in various embodiments of the present invention and a multitude of interspersed vent slot 110 arrangements to provide for venting of outdoor wind and elements through the LED display 100, in accordance with the present invention.

Moreover, the LEDs 104 can be any type of lighting element, such as, for example, miniature LEDs, RGB LEDs, white LEDs, blue LEDs, red LEDs, green LEDs, OLEDs, and the like. In yet other embodiments, the lighting element may be a DIP (dual in-line package) or an SMT (surface mount technology) LED. The DIP is commonly known in the art to be operable to emit a single color (either red, green, or blue). On the other hand, SMT provides a wider range of variable color combinations, as SMT LEDs include red, green, and blue LEDs in a single SMT LED. As is known in the art, SMT may also be referred to as SMD (surface mounted device) LED. In one embodiment, the LEDs 104 are disposed external to the vented LED display 100 (see FIG. 8 for a close-up view of the LED 104). In another embodiment, the LED display panel 102 defines a plurality of apertures with at least a portion of each LED 104 disposed in one of the plurality of apertures. Preferably, the aperture and the corresponding LED 104 disposed therein form a water-tight seal so as to prevent environmental elements from reaching any of the other electrical components that may be housed within the vented LED display 100.

Figure 2:
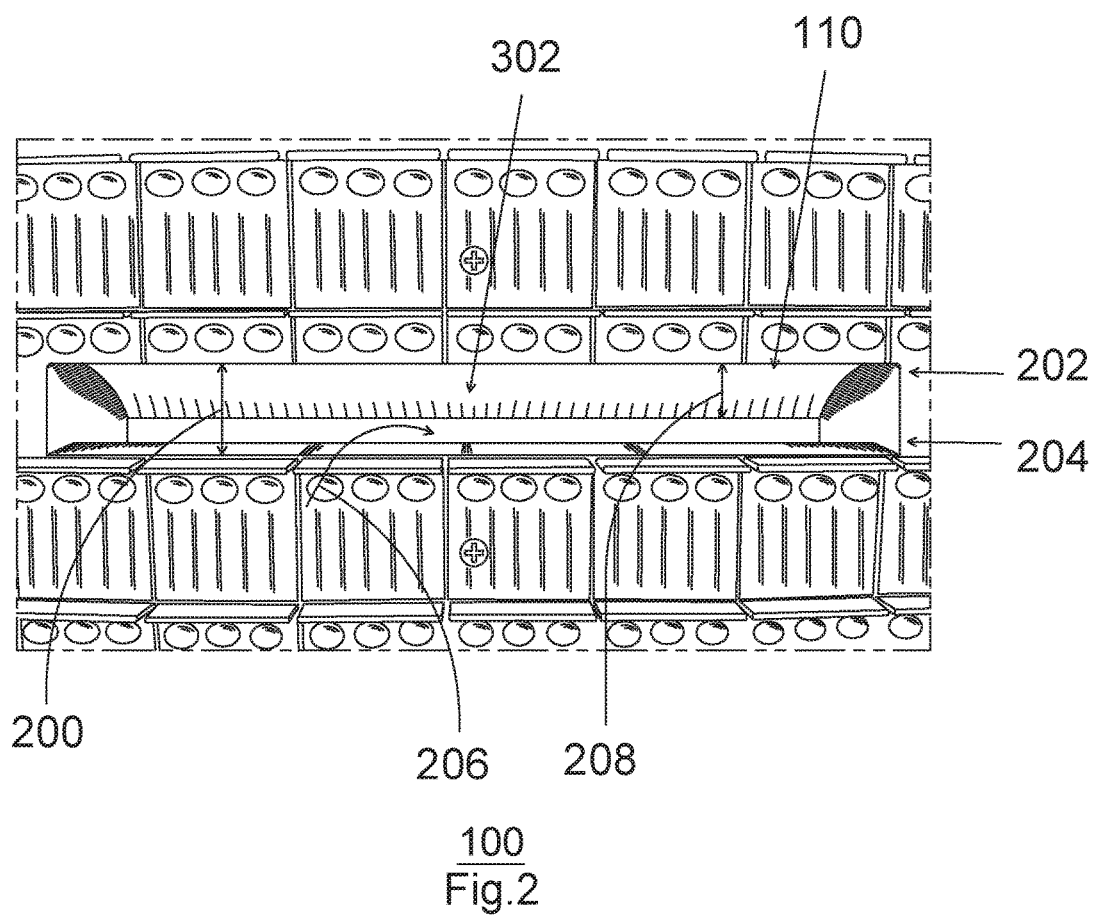
FIG. 2 is a partial, enlarged view of a single vent slot of the vented LED display of FIG. 1, in accordance with an embodiment of the present invention.

Referring now to FIG. 2, an enlarged, partial front view of the LED display 100 is depicted illustrating one embodiment of the vent slot 110. Each of the vent slots 110 may include a vent height 200. In a further embodiment, each of the vent slots 110 may also include a top edge 202 and a bottom edge 204 and the vent height 200 may extend from the top edge 202 to the bottom edge 204. In other words, in one embodiment, the vent height 200 is defined as a vertical distance between the top edge 202 to the bottom edge 204. As used herein, the term "edge" is intended to indicate an outside limit of an object, area, or surface.

Referring now to FIGS. 3-4, the vented LED display 100 may also include a vent 300 couplable to the LED display panel 102 (not shown). The vent 300, advantageously, allows fluid to flow through to the other side from the vent slots 110, in order to reduce wind resistance for the outdoor LED sign, while simultaneously providing an opaque surface spanning at least a portion of the openings of the vent slots 110 so as to provide a contrasting surface for the lights.

In a preferred embodiment, the vent 300 is a unitary structure. Advantageously, this provides a significant advantage over prior art LED displays that are more complicated to manufacture, assemble, repair, and access for maintenance purposes, as discussed above. In one preferred embodiment, the vent 300 is a unitary injection-molded structure. In an alternative embodiment, the vent 300 may be formed as a unitary metallic structure through a die casting manufacturing process. In other embodiments, the vent 300 may be formed with other types of manufacturing processes.

The vent 300 may include a plurality of louvers 302. In a preferred embodiment, the plurality of louvers 302 are formed on the vent 300 through an injection-molding process so that the vent 300 can be easily coupled to the vented LED display panel 102 to form the vented LED display 100. As used herein, the term "louver" is intended to indicate each of a set of angled slats and/or flaps arranged so that at least a portion of the louver allows fluid to pass through. In one embodiment, the plurality of louvers 302 are arranged at regular intervals on the vent 300. Stated another way, each of the plurality of louvers 302 are vertically equidistant from one another. In an alternative embodiment, the plurality of louvers 302 may be arranged at non-regular intervals on the vent 300.

Referring briefly to FIG. 5, an exemplary embodiment of the louver 302 is illustrated in a cross-sectional, side view of one of the plurality of louvers 302. The louver 302 may be provided in many shapes and configuration in various embodiments. For example, the louver 302 may be shaped with a curved surface, or may be provided with a substantially planar (90%+/−10 of the surface of the louver is planar) angled surface. Preferably, the louver 302 is shaped so as to maximize the reduction of wind resistance. In a preferred embodiment, the louver 302 includes a cross-section with a first convex portion 500 and a second convex portion 502 when viewed from a rear face 400 (FIG. 4) of the vent 300. As used herein, the term "rear face" is intended to indicate surface(s) on the rear side of the vent 300 that are viewable by a user viewing the rear side of the vented LED display 100, opposite the front side where the LEDs 104 are disposed. In one embodiment, the first convex portion 500 can be considered disposed forward of the second convex portion 502. In other words, the first convex portion 500 may be disposed closer to the front face 106 than the second convex portion 502. In a further embodiment, the first convex portion 500 may be continuous with the second convex portion 502. Stated another way, the first convex portion 500 may transition into the second convex portion 502. In one embodiment, the louver 302 may be considered to include two adjacent curves or arcs. In another embodiment, the first convex portion 500 may form at least a portion of an electrical component housing for electrical components of the LEDs 104 (see FIG. 1) disposed on the LED display panel 102 (see FIG. 1). In yet another embodiment, the second convex portion 502 provides the opaque surface that spans at least a portion of the openings of the vent slots 110 (see FIG. 2) so as to provide a contrasting surface for the lights.

Referring again to FIG. 2, with brief reference to FIGS. 1 and 4, when the vent 300 and the LED display panel 102 are coupled together to form the LED display 100, each of the plurality of louvers 302 may correspond to at least one vent slot 110. In other words, each of the plurality of louvers 302 is arranged or positioned to align with at least one vent slot 110 when the vent 300 and panel 102 are coupled together in an operational configuration. More specifically, in some embodiments, each of the plurality of louvers 302 is disposed rearward of the corresponding vent slot 110. Such arrangement forms a fluid pathway 206 shaped and configured to allow fluid to flow through the vented LED display 100 from the front face 106 through the rear face 400 for reducing wind resistance. As used herein and for the sake of brevity, the fluid pathway 206 is described herein as allowing fluid to flow from the front face through the rear face; however, it is understood that the shape and configuration of the fluid pathway 206 also allows fluid to flow through the vented LED display 100 in the other direction, from the rear face 400 through the front face 106. As is known in the art, the direction of fluid flow (e.g., wind) will depend on the direction that such environmental elements are traveling as they encounter the vented LED 100 in an outdoor environment. In addition, the fluid pathway 206 may allow rain and other elements through and may also assist with dissipating heat generated by the LEDs 104. In a further embodiment, each of the plurality of louvers 302 is considered to extend rearwardly and downwardly from the top edge 202 of the corresponding vent slot 110. In another embodiment, each of the plurality of louvers 302 is disposed rearward of the LED display panel 102.

Figure 6:
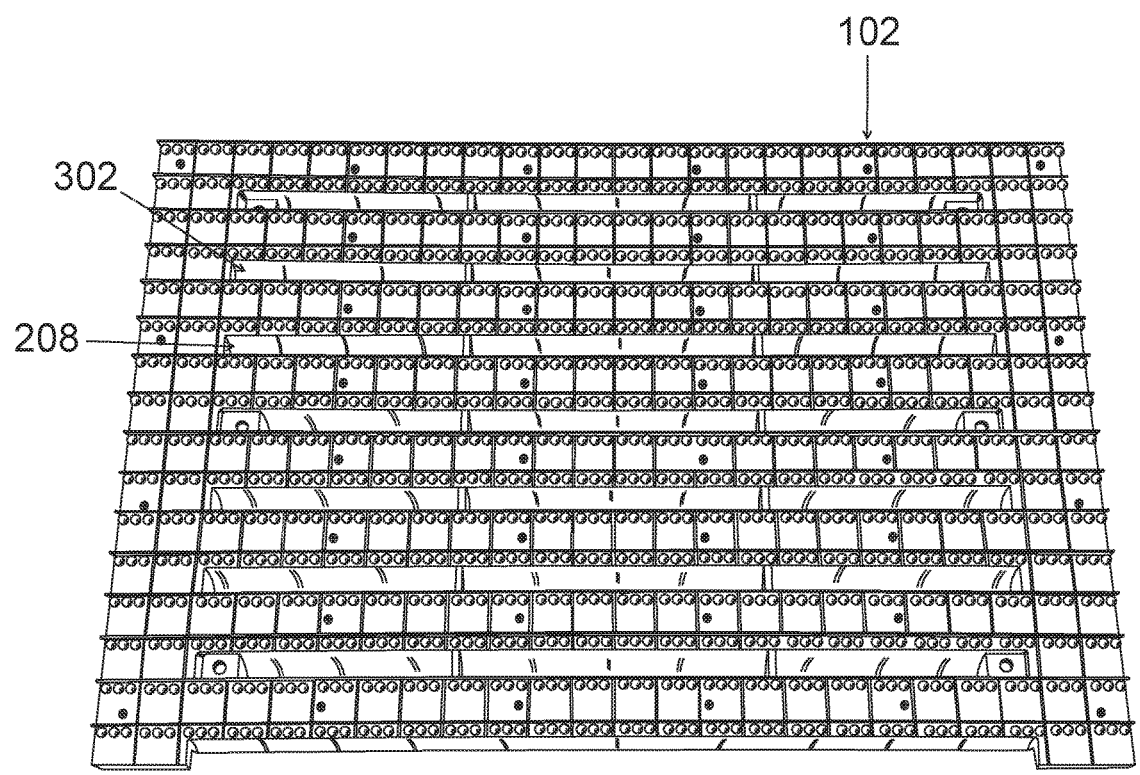
FIG. 6 is a front, upward-looking, perspective view of the vented LED display of FIG. 1, showing the louvers providing opaque surfaces rearward of the vent slots for providing an appearance of solid construction to upward-looking viewers, in accordance with an embodiment of the present invention.

In addition, in one embodiment, the louver 302 includes a louver length 208 that extends downwardly to at least 75% of the vent height 200 of the corresponding vent slot 110. Advantageously, this may provide a surface which, when the vented LED display 100 is viewed from certain angles, provides for a display that appears to viewers to be of solid construction, without any through-openings or vents. Referring briefly now to FIG. 6, in one embodiment, the louvers 302 are shaped and oriented such that when viewed by a viewer from an upward-looking angle, as in FIG. 6, the louvers 302 provide a sufficient louver length 208 that the vented LED display 100 appears to be of a solid construction. As is known in the art, outdoor signs are often positioned relatively high to maximize visibility in an outdoor environment and, therefore, are often viewed by viewers from an upward-looking angle. Accordingly, embodiments of the vented LED display 100 provide the advantage of a venting construction with the appearance of a solid panel body when viewed from certain angles. In one embodiment, the LED display 102 and the louvers 302 are of the same color (e.g., black) and/or the same material (e.g., polymer-based) so as to further provide a solid uniform appearance to viewers. In addition, preferred embodiments of the vented LED display 100 are provided with injection-molded members that are easily coupled together for ease of manufacturing, reducing costs and complexity associated therewith.

Referring again to FIG. 2, with brief reference to FIGS. 1 and 4, in one embodiment, the louver 302 is of an opaque material so as to provide an opaque surface, blocking light from passing through a substantial portion of the vent slot 110. Stated another way, the louver 302 may include an opaque surface disposed rearward of the vent slot 110 and positioned to block light from passing through a substantial portion of the vent slot 110. As used herein, the term "substantial portion" is intended to indicate at least 75% of the vent slot 110. In other embodiments, the louver 302 may also include surfaces that are transparent or semi-transparent. More specifically, in some embodiments, the second convex portion 502 (FIG. 5) provides the louver length 208 that extends downwardly to at least 75% of the vent height 200 of the corresponding vent slot 110. In other embodiments, the louver length 208 extends downwardly to at least 80% of the vent height 200. In yet other embodiments, the louver length 208 extends downwardly to at least 90% of the vent height 200. In yet further embodiments, the louver length 208 extends downwardly to more than 90% of the vent height 200. Advantageously, the louver 302 may provide an opaque surface such that vented LED display 100 appears to be of solid construction, while the vent slots 110 allow the vented LED display 100 to be vented and to reduce wind resistance for the outdoor sign.

Referring now to FIGS. 7-8, the vented LED display 100 is illustrated in a side view and an enlarged partial side view, respectively, showing the LED display panel 102 and the vent 300 coupled together in an operational configuration. In one embodiment, each of the LED display panel 102 and the vent 300 may be a unitary structure, such as an injection-molded member, that can be relatively easily coupled together. The LED display panel 102 and the vent 300 may be coupled together in a multitude of ways, such as, for example, with various types of fasteners (e.g., screws, bolts, snaps, friction-fit fasteners, adhesives, hook-and-loop fasteners, dowel fasteners, and the like). In one embodiment, the LED display panel 102 and the vent 300 together form a housing for one or more electronic components associated with the LEDs 104 disposed on the LED display panel 102. In another embodiment, only one of the LED display panel 102 and the vent 300 is a unitary structure. In yet another embodiment, the vented LED display 100 may be formed as a single unitary structure, rather than, for example, two separate injection-molded members. In yet other embodiments, the LED display panel 102 and the vent 300 may be shaped, formed, and/or configured in other ways. In one embodiment, the electronic components include a printed circuit board (PCB) 700. The PCB 700 may mechanically support and electrically connect the LEDs 104 by, for example, a pattern of conductive tracks etched onto a non-conductive substrate. The LED display panel 102 may be considered a "mask." The mask may be formed as a relatively thin panel defining the plurality of apertures for the LEDs 104 and a plurality of vent slots 110 between rows of apertures. Such mask functions as the front face 106 for the vented LED display 100 to conceal and protect the PCB 700 and form at least a portion of the housing.

Figure 9:
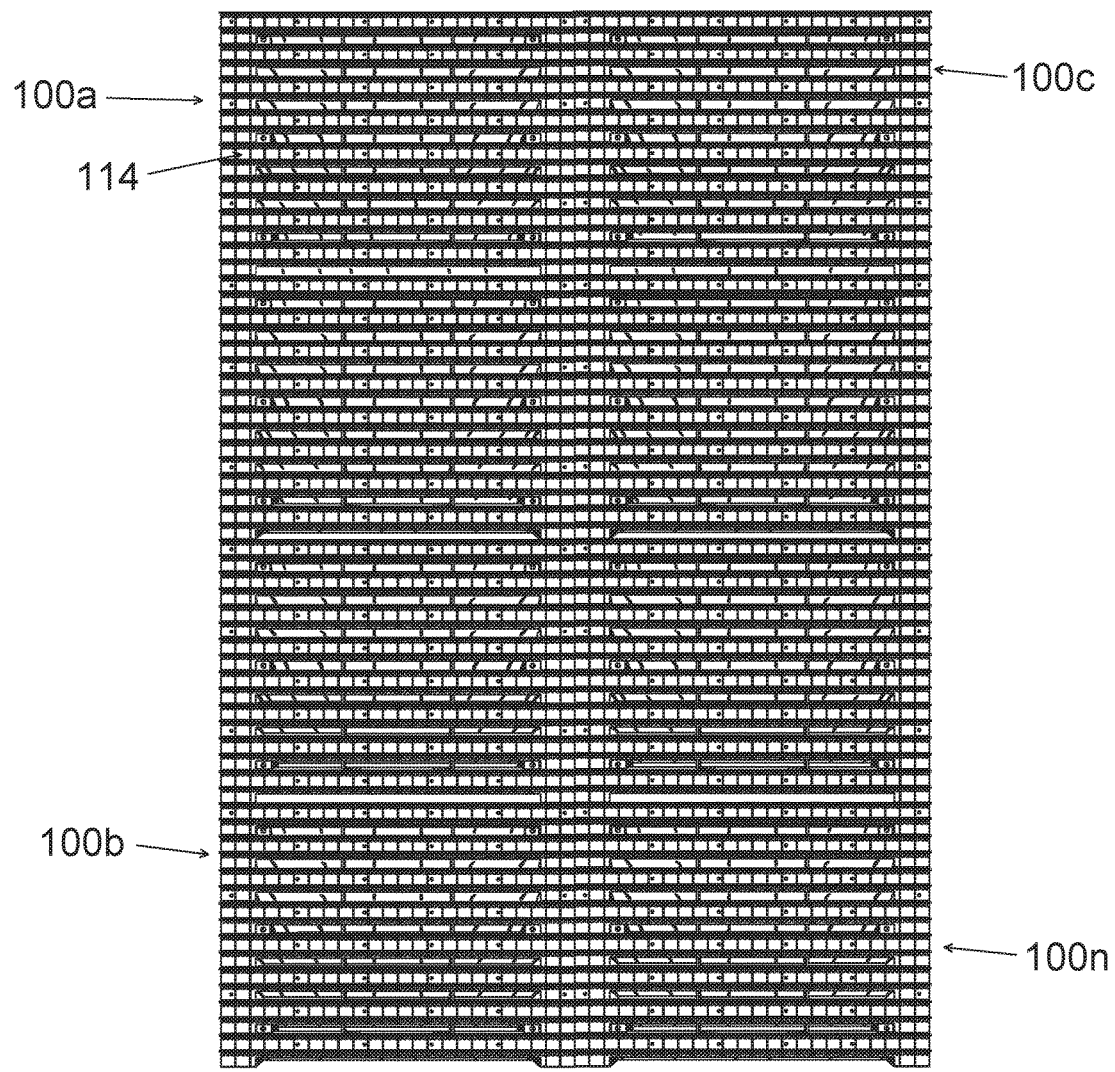
FIG. 9 is a front, perspective view of an assembled outdoor LED sign with a plurality of vented LED displays coupled together to form the outdoor LED sign, in accordance with an embodiment of the present invention.

Referring to FIGS. 5 and 9, in one embodiment, the LED display panel 102 may be formed as a borderless panel. Advantageously, this improves the seamless appearance of a modular embodiment of the vented LED display 100. In other words, and with specific reference to FIG. 9, an outdoor LED sign 900 may be formed by coupling a plurality of vented LED displays 100*a-n* together to form a continuous pattern of LED pixels spanning across the surface area of the outdoor LED sign 900. As used herein, the number of vented LED displays between "a" through "n" can be any number. This is an improvement over prior art LED panels that include borders outlining a periphery of the LED panel such that if such LED panels were coupled together to form a larger sign, the borders would interfere with the uniform appearance of the sign. Stated another way, in one embodiment, the LED rows 114 disposed on each of the plurality of vented LED displays 100*a-n* extends from edge-to-edge such that when the LED display panel 100 is coupled to adjacent LED display panels 100 to form the outdoor LED sign 900 each of the LED rows 114 forms a continuous LED row 114 with adjacent vented LED displays 100 coupled thereto.

Figure 10:
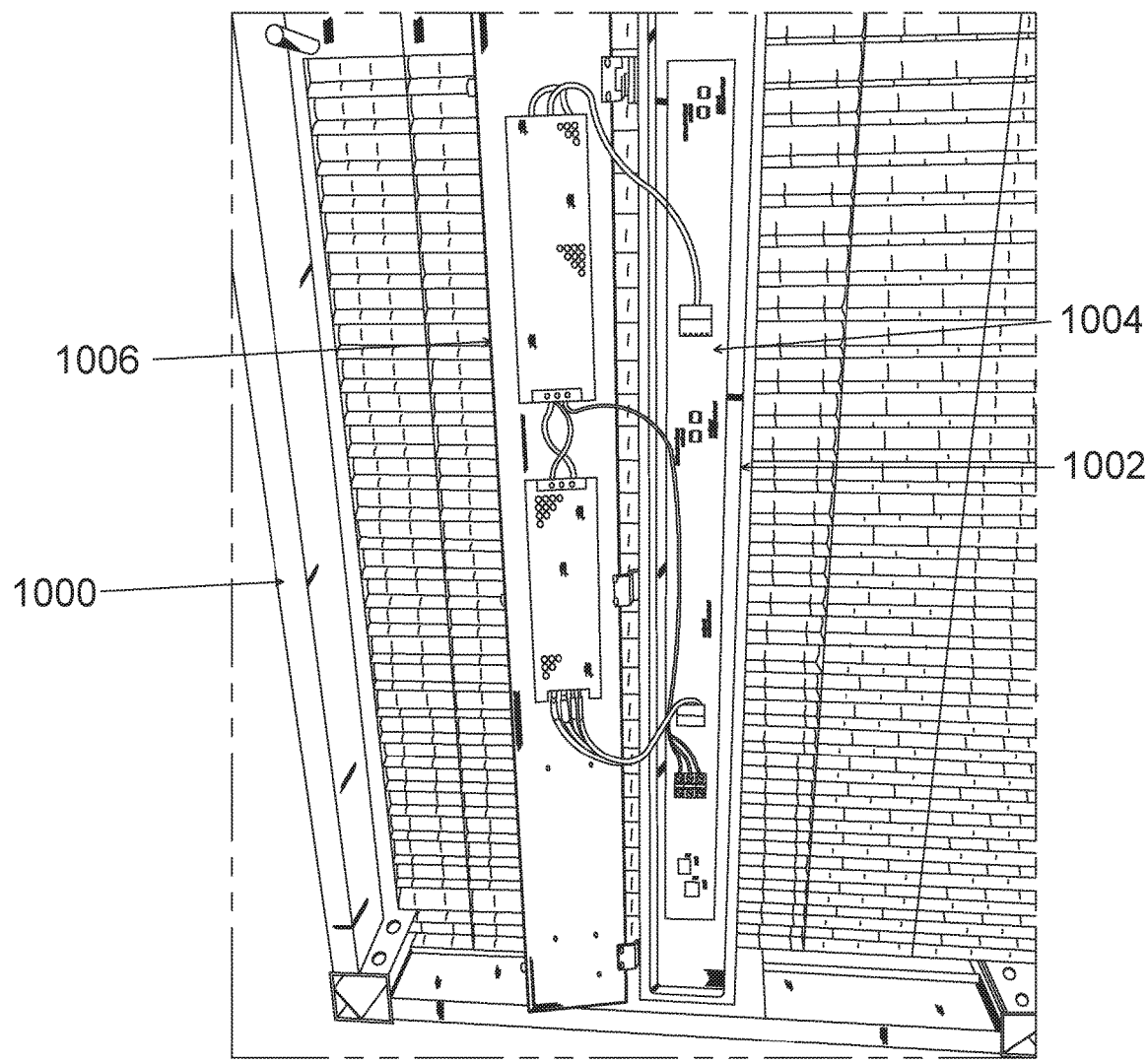
FIG. 10 is a partial, rear, perspective view of the assembled outdoor LED sign of FIG. 9, in accordance with an embodiment of the present invention.

Referring now to FIG. 10, the outdoor LED sign 900 may include a support frame 1000 on which the vented LED displays 100 are mounted. The outdoor LED sign 900 may also include a housing 1002 for a main board 1004 communicatively coupled to and operably configured to power and/or control the LEDs 104 (not shown). In one embodiment, the main board 1004 is a programmable board that allows users to selectively program a message to be displayed on the outdoor LED sign 900. In another embodiment, the housing 1002 may include a hinged or pivotable door 1006 that can be easily opened and closed to access the main board 1004 for selective programming and/or repair and replacement of the same. The main board 1004 can be provided as a printed circuit board for data processing that includes at least a portion that is programmable. In other embodiments, the main board 1004 may be considered a "motherboard" that includes one or more CPUs (central processing units). In one embodiment, the main board 1004 may be provided with a port that allows service technicians to plug-in an electronic device that interfaces with the main board 1004 and allows the service technician to selectively program messages. In other embodiments, the main board 1004 does not allow for selective programmability of messages to be displayed on the outdoor LED sign 900. In such embodiments, the main board 1004 may be programmed or manufactured with a pre-set message at the manufacturing site for the board.

Figures 11, 12:
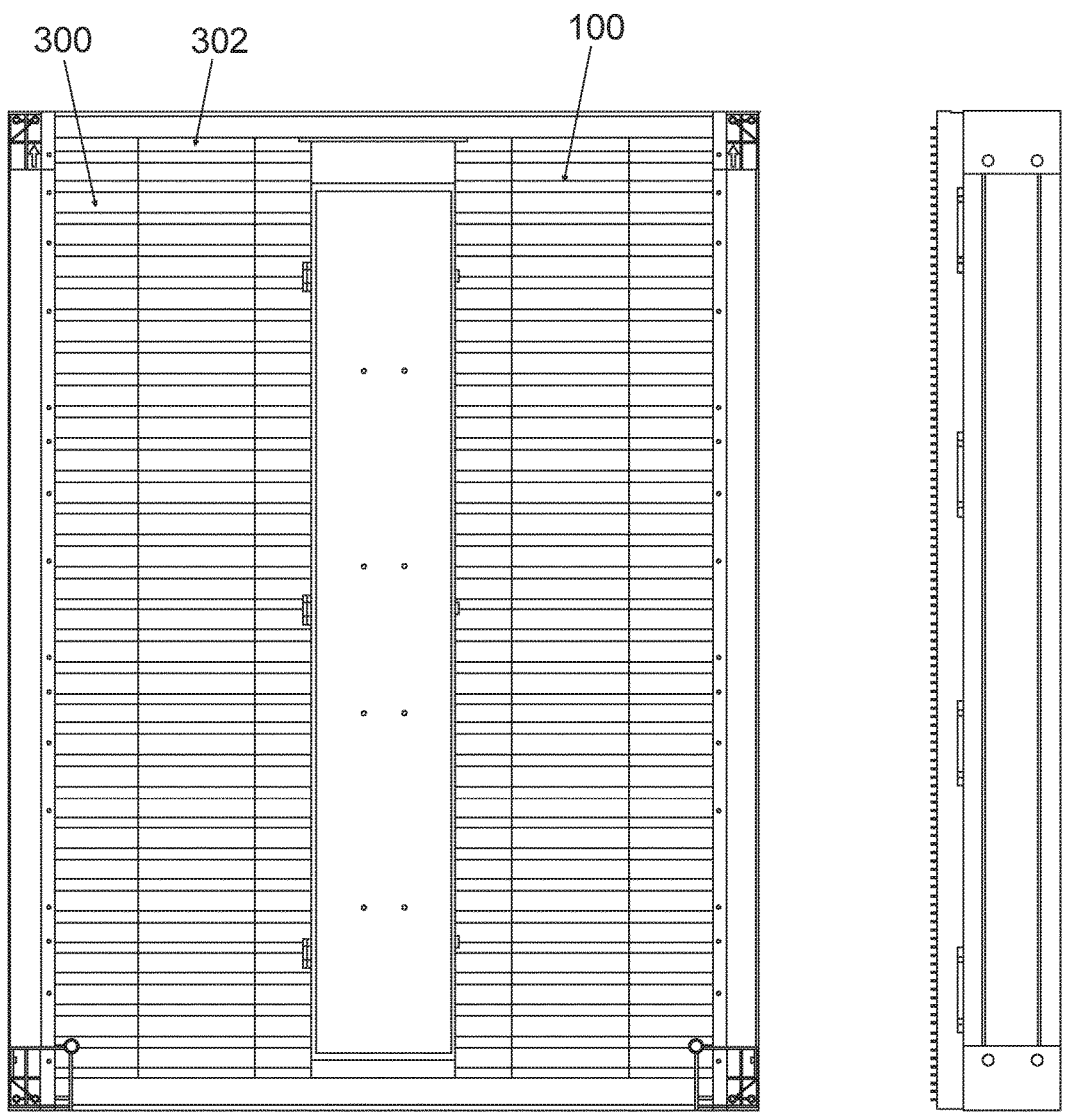
FIG. 11 is an elevational rear view of the outdoor LED sign of FIG. 9, in accordance with an embodiment of the present invention.
FIG. 12 is an elevational left side view of the outdoor LED sign of FIG. 9, in accordance with an embodiment of the present invention.

Referring now to FIGS. 11-16, various views an exemplary embodiment of the outdoor LED sign 900 are illustrated. FIG. 11 is an elevational rear view of the outdoor LED sign 900 showing the vent 300 and louvers 302. In the exemplary embodiment, the outdoor LED sign 900 includes 8 (eight) vented LED displays 100 coupled together (more specifically, 4 (four) vented LED displays 100 coupled together, one above the other, on each opposing side of the housing 1002). In other embodiments, there may be provided other numbers and configurations of vented LED displays 100 coupled together to form the outdoor LED sign 900. In yet other embodiments, the outdoor LED sign 900 may be yet another modular element of yet a larger LED sign, such as an LED billboard. In such embodiments, a multitude of the outdoor LED signs 900, which may also be referred to as cabinets, are coupled together to form a larger outdoor sign. In an exemplary embodiment, an LED billboard may be made up of a 4×19 array of modular outdoor LED signs 900 coupled together to provide a single sign.

Figure 14:
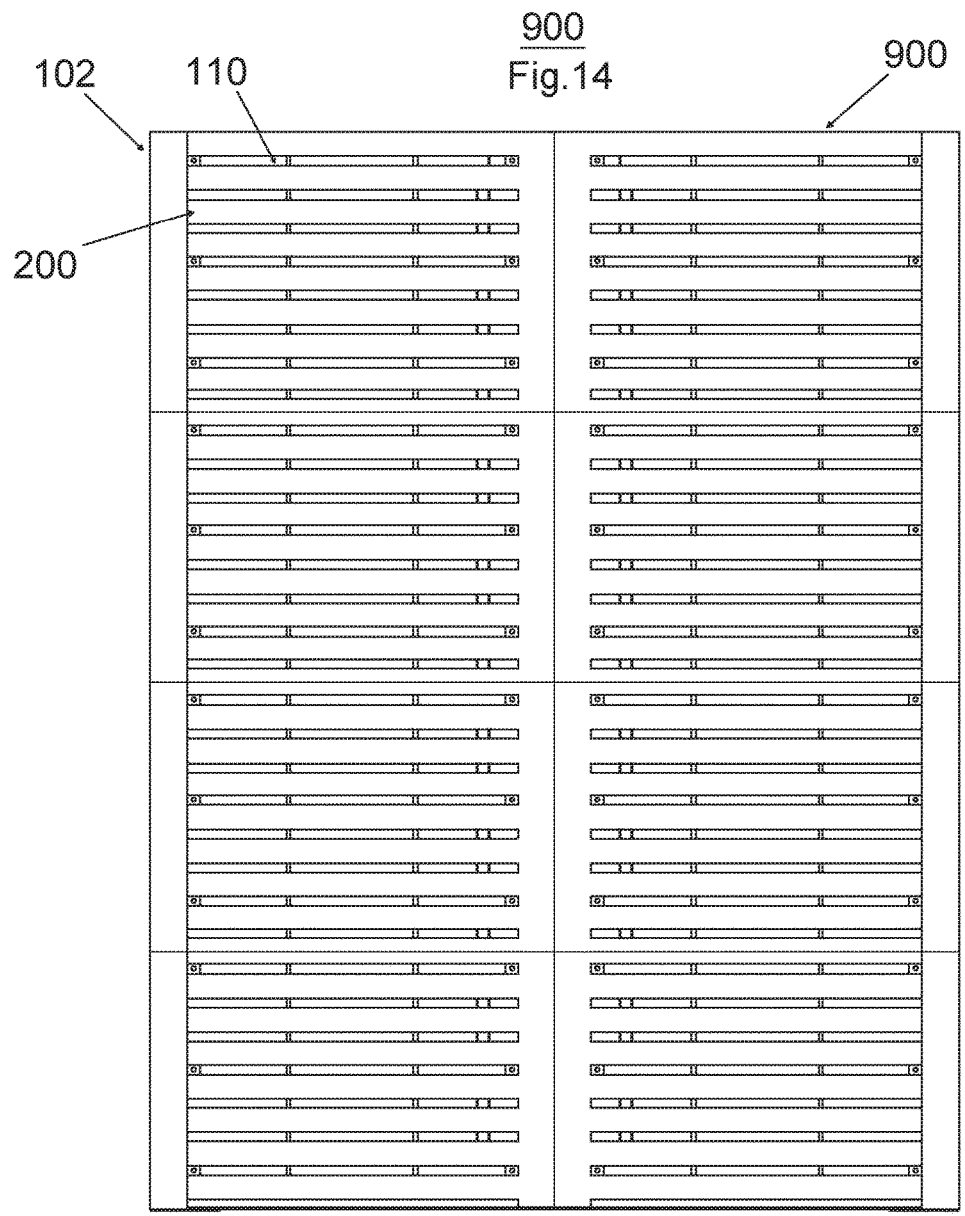
FIG. 14 an elevational front view of the outdoor LED sign of FIG. 9, in accordance with an embodiment of the present invention.
Figure 13:
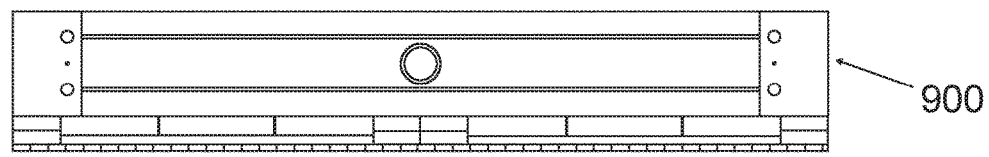
FIG. 13 is a bottom view of the outdoor LED sign of FIG. 9, in accordance with an embodiment of the present invention.

FIGS. 12 and 16 show elevational side views of opposing sides of the outdoor LED sign 900. As can be seen, in the exemplary embodiment, the louvers 302 (not shown) do not extend beyond the sidewalls so as to provide a modular and compact design. FIGS. 13 and 15 shows a top plan view and bottom view, respectively, of the outdoor LED sign 900. FIG. 14 shows an elevational front view of the outdoor LED sign 900 showing the LED display panels 102 defining the plurality of vent slots 110 to allow fluid to pass therethrough. For the sake of clarity of the arrangements of the vent slots 110, the LEDs 104 and the louvers 302 are not shown in FIG. 14. Although not readily apparent from FIG. 14, in a preferred embodiment, the louvers 302 are formed with an opaque surface that extends downwardly covering a substantial portion of the vent height 200 to provide the outdoor LED sign 900 with an appearance of solid construction, when viewed at certain standard viewing angles.

Figure 17:
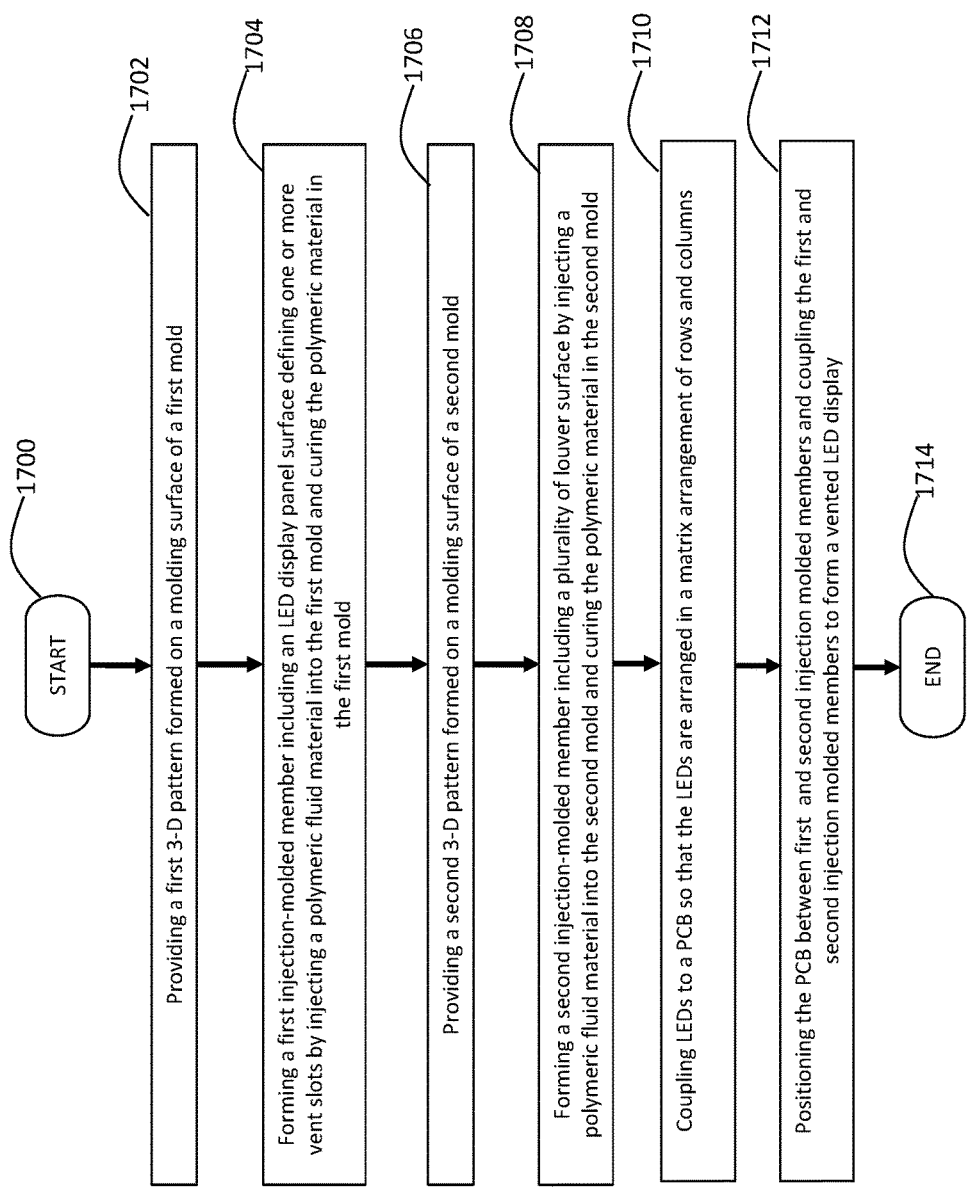
FIG. 17 is a flow chart of an exemplary method of manufacturing a vented LED display, in accordance with an embodiment of the present invention.

An exemplary embodiment of a manufacturing process will be described with reference to the process flow chart of FIG. 17 in conjunction with FIGS. 1-4 and FIG. 7. Although the process flow chart of FIG. 17 shows a specific order of executing the process steps, the order of executing the steps may be changed relative to the order shown in certain embodiments. Also, two or more blocks shown in succession may be executed concurrently or with partial concurrence in some embodiments. Certain steps may also be omitted in FIG. 17 for the sake of brevity.

It is understood that that any molds and/or three-dimensional patterns discussed with reference to the process flow chart of FIG. 17 are for manufacturing embodiments of the LED display panel 102 and vent 300 described herein above and depicted in FIGS. 1-16. Accordingly, it would be understood by persons of ordinary skill in the art that the molds are formed with three-dimensional patterns that would produce the surfaces of the panel 102 and vent 300, as described herein above. Therefore, for the sake of brevity, descriptions of such molding surfaces are not repeated in the following section. Rather, the following section focuses primarily on the manufacturing process steps.

The process may begin, at step 1700, and may immediately proceed to step 1702, where a manufacturer may provide a first three-dimensional (3-D) pattern formed on a molding surface of a first mold, for forming one or more surfaces of the LED display panel 102. In step 1704, a first injection-molded member is formed that includes an LED display panel surface, such as the front face 106. The LED display panel surface defines one or more vent slots 110 arranged and configured as described herein above, with reference to FIGS. 1-16. Further, each vent slot 110 may include the vent height 200. More specifically, the manufacturer may inject a polymeric fluid material into the mold such that the polymeric fluid fills in cavities defined by the first three-dimensional pattern. After the polymeric fluid fills in the first three-dimensional pattern, the manufacturer may cure the polymeric fluid so as to harden, forming a rigid first injection-molded member. The manufacturer may use any known type of injection molding machine(s) and any polymeric fluid (e.g., resins, elastomers, thermoplastics, etc.) known in the art.

In step 1706, the manufacturer may provide a second three-dimensional pattern formed on a molding surface of a second mold, different from the first mold, for forming one or more surfaces of the vent 300 and louvers 302. In step 1708, a second injection-molded member including a plurality of louver surfaces is formed by the manufacturer by injecting the polymeric fluid material into the second mold such that the polymeric fluid fills in cavities defined by the second three-dimensional pattern. After the polymeric fluid fills in the cavities of the second three-dimensional pattern, the manufacturer may cure the polymeric fluid so as to harden the fluid, forming a rigid second injection-molded member including the plurality of louver surfaces. As discussed herein above, in a preferred embodiment, each of the plurality of louver surface includes a louver length 208 that extends downwardly to at least 75% of the vent height 200.

In one embodiment, the first three-dimensional pattern may be formed so as to provide a plurality of apertures on the LED display panel 102 through which the LEDs 104 may be coupled to the LED display panel 102. Accordingly, in step 1710, the manufacturer may couple the LEDs 104 to the PCB 700 so that the LEDs 104 are arranged in the matrix arrangement of rows and columns, described and depicted herein above, separated by the one or more vent slots 110 between the rows, when fully assembled. More particularly, the LEDs 104 are physically and electrically coupled to the PCB 700 to provide the electronic circuitry to control and emit light from the LEDs 104.

In step 1712, after coupling the LEDs 104 to the PCB 700, the manufacturer may couple the PCB 700 between the first and second injection-molded members so as to form the vented LED display 100 in accordance with the present invention. In other words, the PCB is sandwiched between the first-injection-molded member and the second-injection-molded member. In one embodiment, a periphery of the LED display panel 102 is aligned and coupled to a periphery of the vent 300 so as to form a seamless structure for the vented LED display 100. The first and second injection-molded members may be coupled to one another by any known fastener, such as, for example, screws, nuts, bolts, adhesives, etc. Advantageously, embodiments of the method of manufacturing the vented LED display 100 provide a more time-efficient, cost-efficient manufacturing process for making vented LED displays 100. In alternative embodiments, the vented LED display 100 may be formed by a die-cast manufacturing process.

In another embodiment, the PCB 700 (with the LEDs 104 disposed thereon) may be coupled to the vent 300 by fasteners, for example. Subsequently, the PCB 700 may be coupled to the LED display panel 102 by engaging the PCB 700 with a rear side of the LED display panel 102 so that each of the LEDs 104 can be inserted within a plurality of apertures, the apertures defined by the LED display panel 102. This manufacturing step results in the LEDs 104 being positioned forward of the front side of the LED display panel 102 so as to be visible to viewers (as can be clearly discerned in at least FIGS. 7-8). The LED display panel 102 may then be secured to the vent 300 by, for example, fasteners, so as to form the vented LED display 100. The process may end at step 1714.

A novel and efficient vented LED display has been disclosed that is particularly suitable for outdoor usage as an outdoor LED sign. Embodiments of the invention provide a vented LED display module with a front face having a plurality of LEDs disposed thereon in a matrix arrangement of LEDs, the front face defining a plurality of vent slots disposed between LEDs to reduce the wind resistance of the LED sign. In addition, embodiments of the invention provide a rear face formed as a unitary vent having a plurality of louvers that, when the unitary vent is coupled to the front face, defines a plurality of fluid pathways that allows air to flow completely through the vented LED display module. In a further embodiment, the vented LED display module is operably configured to allow air to flow through the vent slots and be directed downward by the corresponding louver. Stated another way, embodiments of the present invention allow air to flow through a matrix arrangement of vent slots defined by the front face and out through the rear face through the plurality of louvers. In addition, embodiments of the present invention provide for the louvers to extend downwardly past a substantial height of the corresponding vent slot so as to provide a contrasting opaque surface for the sign, enhancing viewability thereof by viewers viewing from the sign from the front face.

What is claimed is:

1. A vented LED display comprising:
an LED display panel having a plurality of LEDs disposed thereon and defining a plurality of vent slots, the plurality of LEDs disposed as one or more rows of LED pixels between the plurality of vent slots and each of the plurality of vent slots having a vent height and a vent length and formed as a through-opening of the LED display panel; and
a unitary injection-molded vent being formed as a one-piece continuous injection-molded vent, having a plurality of louvers, and coupled to the LED display panel such that at least a portion of each louver:
  corresponds to at least one vent slot so as to be disposed rearward of and aligned with the at least one vent slot substantially along the vent length of the at least one vent slot;
  includes a louver length extending downwardly to at least 75% of the vent height of the corresponding at least one vent slot; and
  includes a cross-section with a first portion and a second portion, the first portion forming at least a portion of an electrical component housing for at least one of the plurality of LEDs disposed on the LED display panel and the second portion forming the louver length extending downwardly to at least 75% of the vent height of the corresponding at least one vent slot.

2. The vented LED display in accordance with claim 1, wherein:
each louver of the unitary injection-molded vent and each corresponding at least one vent slot of the LED display panel together defining a fluid pathway shaped and configured to allow fluid to flow through the vented LED display from a front face thereof through a rear face thereof.

3. The vented LED display in accordance with claim 1, wherein:
the LED display panel is a borderless panel.

4. The vented LED display in accordance with claim 1, wherein:
the LED display panel is a unitary injection-molded structure.

5. The vented LED display in accordance with claim 1, wherein:
the LED display panel and the unitary injection-molded vent together form a housing for one or more electronic components associated with the plurality of LEDs disposed on the LED display panel.

6. The vented LED display in accordance with claim 1, wherein:
for each vent slot, the corresponding louver includes an opaque surface disposed rearward of the vent slot and positioned to block light from passing through a substantial portion thereof.

7. The vented LED display in accordance with claim 1, wherein:
the LED display panel is a unitary injection-molded structure including a plurality of LED shades positioned above each of the plurality of LEDs disposed on the LED display panel so as to block light emitting from the plurality of LEDs in a vertical direction.

8. The vented LED display in accordance with claim 1, wherein:
the first portion and the second portion are convex portions when viewed from a rear face of the unitary injection-molded vent.

9. The vented LED display in accordance with claim 1, wherein:
the plurality of LEDs disposed on the LED display panel is arranged as a plurality of LED rows disposed between the plurality of vent slots; and
each of the plurality of LED rows extends from edge-to-edge on the LED display panel such that when an adjacent vented LED display is coupled thereto to form an outdoor LED sign each of the LED rows forms a continuous LED row with one or more horizontally adjacent vented LED displays coupled thereto.

10. A vented LED display comprising:
an LED display panel having LEDs disposed thereon and defining a plurality of vent slots, the LEDs disposed as one or more rows of LED pixels between the plurality of vent slots, each of the plurality of vent slots has a vent height and a vent length and is formed as a through-opening of the LED display panel; and
a vent formed as a unitary one-piece continuous structure, coupled to the LED display panel, and having a plurality of louvers, at least a portion of each of the plurality of louvers:
  corresponding to at least one of the plurality of vent slots so as to define a fluid pathway shaped and configured to allow fluid to flow through the vented LED display from a front face thereof through a rear face thereof;
  is disposed rearward of and aligned with the at least one of the plurality of vent slots substantially along the vent length of the at least one of the plurality of vent slots; and
  includes a cross-section with a first portion and a second portion, the first portion forming at least a portion of an electrical component housing for at least one of the LEDs disposed on the LED display panel and the second portion forming a louver length that at least partially defines the fluid pathway.

11. The vented LED display in accordance with claim 10, wherein:
each of the plurality of louvers extends downwardly to at least 75% of the vent height of the corresponding one of the plurality of vent slots.

12. The vented LED display in accordance with claim 10, wherein:
each of the LED display panel and the vent are at least one of an injection molded structure and a die-cast structure.

13. The vented LED display panel in accordance with claim 10, wherein:
wherein the first portion and the second portion are convex portions when viewed from a rear face of the vent.

* * * * *